United States Patent [19]

Marcotte, Jr. et al.

[11] Patent Number: 5,250,392

[45] Date of Patent: Oct. 5, 1993

[54] PROCESS OF DEVELOPING A NEGATIVE-WORKING RADIATION-SENSITIVE PHOTORESIST CONTAINING CYCLIZED RUBBER POLYMER AND CONTRAST ENHANCING AZO DYE

[75] Inventors: Stephen F. Marcotte, Jr., Cumberland, R.I.; John Griffiths, Garforth, United Kingdom

[73] Assignee: OCG Microelectronic Materials, Inc., Cheshire, Conn.

[21] Appl. No.: 9,194

[22] Filed: Jan. 25, 1993

Related U.S. Application Data

[62] Division of Ser. No. 650,341, Feb. 4, 1991, Pat. No. 5,206,110.

[51] Int. Cl.$^5$ ............... G03F 7/30; G03F 7/012; G03C 1/695
[52] U.S. Cl. .................... 430/292; 430/167; 430/196; 430/197; 430/286
[58] Field of Search ............. 430/325, 167, 196, 197, 430/272, 277, 278, 292, 294, 286

[56] References Cited

U.S. PATENT DOCUMENTS

| | | |
|---|---|---|
| 3,925,077 | 12/1975 | Lewis et al. . |
| 3,969,118 | 7/1976 | Stahlhofen et al. . |
| 4,330,612 | 5/1982 | Tashiro et al. ............ 430/286 |
| 4,467,025 | 8/1984 | Goto et al. ............ 430/191 |
| 4,575,480 | 3/1986 | Kotani et al. ............ 430/192 |
| 4,626,492 | 12/1986 | Eilbeck ............ 430/191 |
| 4,677,043 | 6/1987 | Cordes, III et al. ............ 430/22 |
| 4,789,619 | 12/1988 | Ruckert et al. ............ 430/270 |

FOREIGN PATENT DOCUMENTS

| | | |
|---|---|---|
| 48214 | 3/1982 | European Pat. Off. . |
| 263921 | 4/1988 | European Pat. Off. . |

OTHER PUBLICATIONS

Housley et al. "Dyes in Photoresists: Today's View", Semiconductor International, Apr. 1988, pp. 142-144.

*Primary Examiner*—Richard L. Schilling
*Assistant Examiner*—Christopher G. Young
*Attorney, Agent, or Firm*—William A. Simons

[57] ABSTRACT

A negative-working, radiation-sensitive composition comprising an admixture in a solvent of:
(a) at least one cyclized rubber polymer,
(b) at least one photoactive compound, and
(c) an effective contrast enhancing amount of at least one rubber-soluble azo dye containing a reactive acrylate or methacrylate group of formula (I):

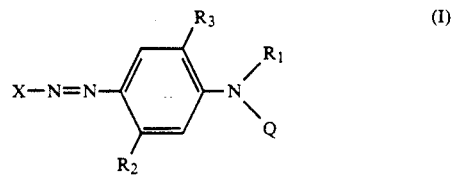

wherein Q is a reactive group of the structure

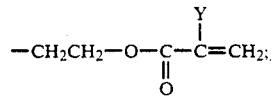

wherein Y is either H or $CH_3$; wherein $R_1$ is either H, $CH_3$, $C_2H_5$, $CH_2CH_2CN$, CH $CH_2OH$ or Q;
wherein $R_2$ is either H, $CH_3$, $OCH_3$, or $NHCOCH_3$;
wherein $R_3$ is either H, $OCH_3$ or $OC_2H_5$; and
wherein X is selected from the group consisting of an unsubstituted or a substituted benzene, thiazole, thiophene, benzothiazole, benzoisothiazole, thiadiazole, and pyrazole moiety having, if substituted, 1-3 substituent groups selected from cyano, nitro, acetyl, and halogen groups; the amount of said cyclized rubber being about 90% to 99.5% by weight, the amount of said photoactive component being about 0.5% to about 10% by weight, based on the total solids content of said radiation-sensitive composition.

6 Claims, No Drawings

PROCESS OF DEVELOPING A NEGATIVE-WORKING RADIATION-SENSITIVE PHOTORESIST CONTAINING CYCLIZED RUBBER POLYMER AND CONTRAST ENHANCING AZO DYE

This application is a division of application Ser. No. 07/650,341 filed Feb. 4, 1991 which issued as U.S. Pat. No. 5,206,110 on Apr. 27, 1993.

BACKGROUND OF THE INVENTION

1. Field of the Invention

The present invention relates to dyed negative-working radiation-sensitive mixtures (e.g. those particularly useful as negative-working resist compositions) containing the admixture of a cyclized rubber polymer, a photoactive compound and an effective contrasting amount of at least one selected rubber-soluble soluble azo dye containing a reactive acrylate or methacrylate group all dissolved in a solvent. Furthermore, the present invention also relates to substrates coated with these radiation-sensitive mixtures as well as the process of coating, imaging and developing these radiation-sensitive mixtures on these substrates.

2. Brief Description of the prior Art

Photoresist compositions are used in microlithographic processes for making miniaturized electronic components such as in the fabrication of integrated circuits and printed wiring board circuitry. In these processes, a thin coating or film of a photoresist composition is generally first applied to a substrate material, such as silicon wafers used for making integrated circuits or aluminum or copper plates of printed wiring boards. The preferred method of applying this film is spin coating. By this method, much of the solvent in the photoresist formulation is removed by the spinning operation. The coated substrate is then baked to evaporate any remaining solvent in the photoresist composition and to fix the coating onto the substrate. The baked coated surface of the substrate is next subjected to an image-wise exposure of radiation. This radiation exposure causes a chemical transformation in the exposed areas of the coated surface. Visible light, ultraviolet (UV) light, electron beam, ion beam, and X-ray radiant energy are radiation types commonly used today in microlithographic processes.

After this image-wise exposure, the coated substrate is treated with a developer solution to dissolve and remove either the radiation-exposed or the unexposed areas of the coated surface of the substrate. In some processes involving positive resists, it is desirable to bake the imaged resist coating before this developing step. This intermediate step is sometimes called post-exposure bake or PEB.

There are two types of photoresist compositions—negative-working and positive-working. When negative-working photoresist compositions are exposed image-wise to radiation, the areas of the resist composition exposed to the radiation become less soluble to a developer solution (e.g., a cross-linking reaction occurs) while the unexposed areas of the photoresist coating remain relatively soluble to a developing solution. Thus, treatment of an exposed negative-working resist with a developer solution causes removal of the nonexposed areas of the resist coating and the creation of a negative image in the photoresist coating, and thereby uncovering a desired portion of the underlying substrate surface on which the photoresist composition was deposited but not exposed to the radiation. On the other hand, when positive-working photoresist compositions are exposed image-wise to radiation, those areas of the resist composition exposed to the radiation become more soluble to the developer solution (e.g., the Wolff rearrangement reaction of the photoactive compound occurs) while those areas not exposed remain relatively insoluble to the developer solution. Thus, treatment of an exposed positive-working resist with the developer solution causes removal of the exposed areas of the resist coating and the creation of a positive image in the photoresist coating. The desired portion of the underlying substrate surface is uncovered where the photoresist was exposed to the radiation.

Positive-working photoresist compositions are currently favored over negative-working resists because the former generally have better resolution capabilities and pattern transfer characteristics. Yet negative-working resist are employed still in many specific applications.

One disadvantage with both conventional positive-working and negative-working resists is that they act as being transparent when coated on highly reflective substrates such as aluminum and other metals. This transparency property may lead to imprecise measurements of critical dimensions and pre-exposure alignments. With positive-working resists, it has been possible in the past to add one or more of a wide variety of nonactinic or contrast dyes to the resist composition. Contrast dyes enhance the visibility of the developed images and facilitate pattern alignment during manufacturing. Example of contrast dye additives which have been used in positive-working resists include Solvent Red 24 (C.I. No. 26105), Basic Fuchsin (C.I. 42514), Oil Blue N (C.I. No. 61555), and Calco Red A (C.I. No. 26125). However, the use of such known contrast dyes with negative-working resists having cyclized rubber as the binder polymer do not work because they rinse out of the negative-working resist during the wet development step with the commonly used negative resist organic developers such as liquid isoparaffinic hydrocarbon solutions or aromatic compounds such as xylene. Accordingly, there is a need for a contrast dye which can be incorporated in a negative-working resist having a cyclized rubber polymer, yet will not rinse out during the development step using a negative resist developer. The present invention is a solution to this need.

BRIEF SUMMARY OF THE PRESENT INVENTION

Accordingly, the present invention is directed to a radiation sensitive composition useful as a negative-working resist comprising an admixture in a solvent of:
(a) at least one cyclized rubber polymer;
(b) at least one photoactive compound; and
(c) an effective contrasting amount of at least one rubber-soluble azo dye containing a reactive acrylate or methacrylate group of the formula (I):

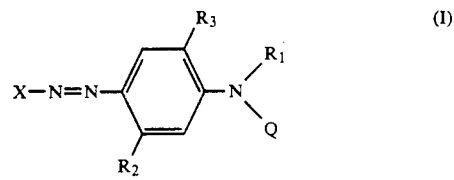

wherein Q is a reactive group of the structure

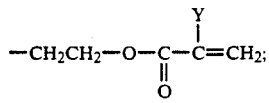

wherein Y is either H or CH$_3$;

wherein R$_1$ is either H, CH$_3$, C$_2$H$_5$, CH$_2$CH$_2$CN, CH$_2$CH$_2$OH or Q;

wherein R$_2$ is either H, CH$_3$, OCH$_3$, or NHCOCH$_3$;

wherein R$_3$ is either H, OCH$_3$ or OC$_2$H$_5$; and wherein X is selected from the group consisting of an unsubstituted or a substituted benzene, thiazole, thiophene, benzothiazole, benzoisothiazole, thiadiazole, or pyrazole moiety having, if substituted, 1-3 substituent groups selected from cyano, nitro, acetyl, and halogen groups; the amount of said photoactive compound or compounds being about 0.5% to about 10% by weight and the amount of said cyclized rubber or rubbers being about 90% to 99.5% by weight, based on the total solids content of said radiation-sensitive mixture.

Furthermore, the present invention also encompasses the process of coating substrates with these radiation-sensitive mixtures and their exposing and developing these coated substrates.

Also further, the present invention encompasses said coated substrates (both before and after imaging) as novel articles of manufacture.

DETAILED DESCRIPTION

As mentioned above, the negative-working, radiation-sensitive compositions of the present invention have three critical ingredients; at least one cyclized rubber; at least one photoactive compound; and at least one rubber-soluble azo dye containing a reactive acrylate or methacrylate group.

Any or all cyclized rubber polymer commonly employed in negative-working resist compositions may be used herein. The preferred class of cyclized rubber polymers is cyclized polyisoprene rubbers which are useful in negative-working resist compositions. They preferably have molecular weights from about 1,000 to about 40,000, and more preferably from about 1,500 to 20,000.

Any and all photoactive compounds which make radiation-sensitive mixtures useful as negative-working photoresists may be employed herein. The preferred class of photoactive compounds for this invention are aromatic bisazides. The most preferred photoactive compound (sometimes called "sensitizer") is bis-2,6-(4-azidobenzylidene) 4-methyl cyclohexanone (also referred to as "ABC Sensitizer").

The preferred proportion of the photoactive compound in the radiation-sensitive mixture may range from about 1% to about 6%, more preferably from about 2% to about 5% by weight of the nonvolatile (e.g., nonsolvent) content of the radiation-sensitive mixture. The preferred proportion of cyclized rubber resin of this present invention in the radiation-sensitive mixture may range from about 94% to about 99%, more preferably, from about 95% to 98% by weight, of the nonvolatile (e.g. excluding solvents) content of the radiation-sensitive mixture.

The third critical ingredient of the radiation-sensitive composition of the present invention is the rubber-soluble azo dye containing a reactive acrylate or methacrylate group or mixture of such dyes. The most preferred rubber-soluble azo dyes containing a reactive acrylate or methacrylate group have either formulae (II) and (III):

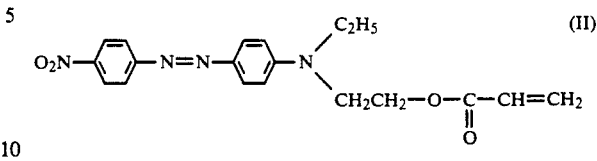

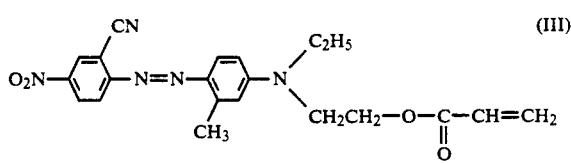

The term "effective contrasting amount", as used in this specification and claims, refers to an amount of contrasting dye or dyes of the present invention in the resist composition which is homogeneously dispersed throughout the resist composition and makes the resist coating visible to the human eye or to appropriate inspection and/or alignment instrumentation so that measurement of resist critical dimensions and alignment features may be carried out. The preferred proportion of the rubber-soluble azo dye group in the radiation-sensitive mixture may range from about 0.001% to about 4.0%, more preferably about 0.01% to 2.0% by weight of the nonvolatile (e.g., excluding solvents) content of the radiation-sensitive mixture.

Besides the rubber, photoactive compound and dye, these radiation-sensitive mixtures may also contain, conventional photoresist composition ingredients such as solvents, actinic dyes, anti-halation agents, plasticizers, sensitivity enhancers, and the like. These additional ingredients may be added to the binder resin, photoactive compound and dye before the photoresist composition is coated onto the substrate.

The binder rubber, photoactive compound or sensitizer, and dye may be dissolved in a solvent or solvents to facilitate their application to the substrate. Any conventional coating solvent used for negative resist may be used herein. Aromatic solvents such as benzene, toluene, and xylenes are the preferred class. Xylenes are most preferred. The preferred amount of solvent is sufficient so that the total solids content of the resist composition is from about 5% to about 50%, more preferably from about 7% to about 40% by weight solids before the resist is cast onto a substrate.

Actinic dyes help provide increased resolution on highly reflective surfaces by inhibiting back scattering of light off the substrate. This back scattering causes the undesirable effect of optical notching, especially on a substrate topography. Examples of actinic dyes include those that absorb light energy at approximately 400–460 nm [e.g. Fat Brown B (C.I. No. 12010); Fat Brown RR (C.I. No. 11285); 2-hydroxy-1,4-naphthoquinone (C.I. No. 75480) and Quinoline Yellow A (C.I. No. 47000) and Macrolex Fluoroyellow 10GN (C. I. No. Solvent Yellow 16:1)] and those that absorb light energy at approximately 300-340 nm [e.g. 2,5-diphenyloxazole (PPO-Chem. Abs. Reg. No. 92-71-7) and 2-(4-biphenyl)-6-phenyl-benzoxazole (PBBO-Chem. Abs. Reg. No. 17064-47-0)]. Of course, these actinic dyes should be soluble in the negative resist coating solvent. The amount of actinic dyes may be up to 10% weight levels, based on the combined weight of resin and sensitizer.

The prepared radiation-sensitive resist mixture can be applied to a substrate by any conventional method used in the photoresist art, including dipping, spraying, whirling, and spin coating. When spin coating, for example, the resist mixture can be adjusted as to the percentage of solids content in order to provide a coating of the desired thickness given the type of spinning equipment and spin speed utilized and the amount of time allowed for the spinning process. Suitable substrates include silicon, aluminum, or polymeric resins, silicon dioxide, doped silicon dioxide, silicon resins, gallium arsenide, silicon nitride, tantalum, copper, polysilicon, ceramics, and aluminum/copper mixtures.

The radiation-sensitive composition or photoresist coatings produced by the above described procedure are particularly suitable for application to silicon/silicon dioxide-coated or polysilicon or silicon nitride wafers such as are utilized in the production of microprocessors and other miniaturized integrated circuit components. An aluminum/aluminum oxide wafer can be used as well. The substrate may also comprise various polymeric resins especially transparent polymers such as polyesters and polyolefins.

After the resist solution is coated onto the substrate, the coated substrate may be preferably baked at approximately 60° C. to 110° C. until substantially all the solvent has evaporated and only a uniform radiation-sensitive coating remains on the substrate.

The coated substrate can then be exposed to radiation, in any desired exposure pattern, produced by use of suitable masks, negatives, stencils, templates, and the like. Conventional imaging process or apparatus currently used in processing photoresist-coated substrates may be employed with the present invention. While ultraviolet (UV) light and electron beam radiations are the preferred sources of radiation, other sources such as visible light, ion beam, and X-ray radiant energy may be instead used.

The exposed resist-coated substrates are next developed in an organic developing solution. Examples of organic developers include long chain aliphatic hydrocarbons or aromatics such as xylene. One preferred developer for this invention is xylene in combination with a Stoddard Solvent. Another preferred developer is a liquid isoparaffinic hydrocarbon solution such as an isopar solution.

Development techniques such as immersion development, spray development or puddle development, or combinations thereof, may also be used.

The substrates are allowed to remain in the developer until all of the resist coating has dissolved from the unexposed areas. Normally, development times from about 10 seconds to about 3 minutes are employed.

After selective dissolution of the coated wafers in the developing solution, they are preferably subjected to a solvent rinse to fully remove the developer or any remaining undesired portions of the coating and to stop further development. This rinsing operation (which is part of the development process) may be followed by drying with filtered air. A post-development heat treatment or bake may then be employed to increase the adhesion and chemical resistance of the coating to etching solutions and other substances. The post-development heat treatment involves the baking of the coating and substrate below the coating's thermal deformation temperature.

In the manufacture of microcircuitry units, the developed substrates may then be treated with a wet etching solution or a plasma gas etch. Conventional wet etching or plasma processing parameters and equipment may be employed.

Later, the remaining areas of the photoresist coating may be removed from the etched substrate surface by conventional photoresist stripping operations.

The present invention is further described in detail by means of the following Examples. All parts and percentages are by weight unless explicitly stated otherwise.

EXAMPLE 1

A. Synthesis and Purification of 4-(N-ethyl-N-2-acryloyl-oxyethyl)amino-4'-nitroazobenzene (also known as Dye NRD-3)

The dye 4-(N-ethyl-N-2-hydroxyethyl)amino-4'-nitroazobenzene (1.55 g) was heated under reflux in dry acetone (100 ml), and to the solution was added acryloyl chloride (2.0 ml) After refluxing for 5 minutes, a mixture of pyridine (1 ml) and dry acetone (4 ml) was added dropwise over 20 minutes, with continuous refluxing. At this stage, thin-layer chromatography showed no starting material remaining. Activated carbon (1 g) was added to the solution, and the mixture was stirred for 5 minutes at room temperature. Then chromatography grade neutral alumina (4 g) was added and stirring continued for 5 minutes. The mixture was then filtered, and after evaporation of the acetone from the filtrate a red gum was obtained. This was triturated with a mixture of ether and ligroin to give the above-identified dye NRD-3 as a dark red solid (0.8 g). Absorption maximum: $\lambda max = 484$ nm in dichloromethane.

B. Small Scale Film Solubility Testing of NRD-3

Dye NRD-3 (0.8 g) was added to 10 ml of an Olin Hunt negative resist (WAYCOAT® HNR-999—Catalog No. 840280) and stirred at room temperature for 15 minutes. WAYCOAT HNR-999 is a negative-working resist containing a polyisophrene rubber and an ABC sensitizer dissolved in xylene. The solution was filtered to remove undissolved dye, giving an intense Orange-red resist solution saturated with the dye. The resist was applied to clean glass microscope slides, and the slides held vertically for 5 minutes to drain. The slides were then dried in an oven at 100° C. for 10 minutes and their absorption spectra recorded over the range 380–700 nm. The resist layer showed a peak at 480 nm due to the dye. The slides were then exposed to light from a high pressure mercury arc lamp, filtered to isolate principally radiation in the 300–350 nm range for 3–5 seconds. The spectra of the slides were re-recorded, showing that the dye survived the exposure period and that little change in the absorbance of the dye had resulted. The slides were then developed with Olin Hunt WNRD developer (Catalog No. 837773) for 15 seconds, followed by a 5 second rinse with n-butyl acetate and air-dried. This WNRD developer is a liquid isoparaffinic hydrocarbon solution. The absorption spectrum of the slides were measured again, and it was found that in the exposed areas of the slide the dye NRD-3 was still present in the resin, with little loss in absorbance. The unexposed areas of the slides showed no residual resin or dye.

EXAMPLE 2

A. Synthesis and purification of 2-Methyl-4-(N-ethyl-N-2-acryloyloxyethyl)amino-2'-cyano-4'-nitroazobenzene (also known as Dye NRD-4)

The dye 2-methyl-4-(N-ethyl-N-hydroxyethyl)amino-2'-cyano-4'-nitroazobenzene (1.7 g) was heated under reflux in dry acetone (100 ml) and to this was added acryloyl chloride (2 ml). A mixture of pyridine (1 ml) and dry acetone (4 ml) was added dropwise to the refluxing solution over 15 minutes. The solution was cooled and activated charcoal (1 g) added, and the mixture stirred for 5 minutes. Chromatographic grade neutral alumina (5 g) was added, and stirring continued for 5 minutes. The mixture was filtered, and the filtrates evaporated to give a deep purple gum. This was triturated with a mixture of diethyl ether and ligroin until it crystallized. The resultant dye NRD-4 was filtered off as a purple-black solid (0.86 g). The dye showed an absorption maximum at 540 nm in polyisoprene. Absorption maximum: $\lambda$ max=533 nm in dichloromethane.

B. Small Scale Film Solubility Testing of Dye NRD-4

To 10 ml of an Olin Hunt negative resist solution (WAYCOAT HNR-999—Catalog No. 840280) was added the dye NRD-4 (0.6 g) and the solution was filtered. The resin was applied to glass microscope slides and allowed to drain vertically for 5 minutes to give a uniform thin film. The slides were dried in an oven at 100° C. for 10 minutes, giving clear deep purple-red films. The absorption spectra of the coated slides were recorded, and then the slides were exposed to ultraviolet light for 5 seconds, as detailed in the previous procedure for NRD-3. Absorption spectroscopic analysis showed that only slight loss of color had occurred after exposure. The slides were then developed in Olin Hunt WNRD developer (Catalog No. 837773) for 15 seconds and rinsed for 5 seconds in n-butyl acetate. After drying, the absorption spectra of the brown-purple coatings were measured showing that at least 80% of the dye remained in the films (absorption maximum at ca. 540 nm).

EXAMPLE 3

Large Scale Testing of NRD-4

A. Preparation of Dyed Resist

Fifty grams of WAYCOAT Negative Resist IC 28 Type III (Catalog number 837203) available from Olin Hunt Specialty Products Inc. of West Paterson, N.J. and 0.1 grams of NRD-4 due were mixed in an amber glass bottle. This IC 28 Type III Resist contains cyclized polyisoprene rubber, bis-2,6-(4-azidobenzylidene)-4-methyl cyclohexanone as the sensitizer in a mixture of xylenes and ethyl benzene. The photoresist solution was then filtered to remove particles greater than 0.2 microns, using a 47 mm barrel filter (100 ml) available from Millipore Corporation.

B. Coating of Silicon Wafers

The photoresist solution was spun-coated onto a silicon wafer at 5,000 RPMS for 30 seconds using a spin coater available from Silicon Valley Group (Model No. 8026PC). The silicon wafers were previously vapor primed with hexamethyldisilazane for 10 minutes. The photoresist-coated wafers were baked at 105° C. for 5 minutes using an infrared tunnel oven available from Silicon Valley Group (Model No. 8030IR).

C. Exposure of the Coated Wafers

The coated wafers were then exposed on a Perkin Elmer 300 HT Microalign (Model #340) at approximately 50 mJ/cm$^2$ using a standard line/space mask of various dimensions from 0.25 to 50 microns. The exposure wavelength was broad band from 330 nm to 450 nm with a major spectral peak at 365 nm.

D. Wet Development of Exposed, Coated Wafers

The exposed wafers were then developed with a negative photoresist wet developing solution, namely WAYCOAT® WNRD developer (Catalog No. 837773). This developer is a liquid isoparaffinic hydrocarbon solution. This was done by pouring 5 ml of developer onto each exposed wafer and then contacting each wafer for 20 seconds to remove the unexposed portions of the photoresist coating from the wafer. The developing solution was poured off the wafer into a beaker, and the wafer was rinsed with n-butyl acetate to stop the development process. The wafers were then blown dry with filtered nitrogen.

E. Observations

The exposed portions of the photoresist coating which remained on the silicon wafer after development were still visibly dyed. The collected development solution after the development step contained no visible color. The observations indicated that no dye leached out of the photoresist coating during development.

While the invention has been described above with reference to specific embodiments thereof, it is apparent that many changes, modifications, and variations can be made without departing from the inventive concept disclosed herein. Accordingly, it is intended to embrace all such changes, modifications, and variations that fall within the spirit and broad scope of the appended claims. All patent applications, patents, and other publications cited herein are incorporated by reference in their entirety.

What is claimed is:

1. The process of developing an image-wise exposed photoresist-coated substrate comprising:
    (1) coating said substrate with a negative-working, radiation-sensitive composition useful as a photoresist, said composition comprising an admixture in a solvent of:
        (a) at least one cyclized rubber polymer;
        (b) at least one photoactive compound; and
        (c) an effective contrast enhancing amount of an azo dye of the formula:

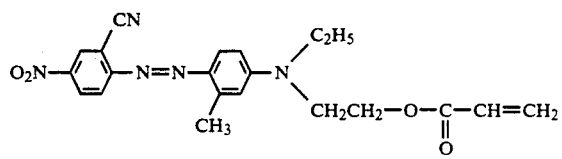

(2) subjecting said coating on said substrate to an image-wise exposure of radiant light energy; and
    (3) subjecting said image-wise exposed coating substrate to a developing solution to remove the nonexposed image-wise area of said coated radiation-sensitive composition with said developing solution and to form a negative image-wise pattern in the coating.

2. The process of claim 1 wherein said cyclized rubber polymer is a cyclized polyisoprene resin.

3. The process of claim 1 wherein said photoactive compound is bis-2,6-(4-azidobenzylidene) 4-methyl cyclohexanone.

4. The process of claim 1 wherein said photoactive compound or compounds are present in the amount of about 1% to about 6% by weight, said cyclized rubber polymer is present in the amount of about 94% to about 99% by weight, and said dye is present in the amount of 0.001% to about 4.0% by weight, all based on the total solids content of said radiation-sensitive composition.

5. The process of claim 1 further comprising at least one substance selected from the group consisting of solvents, actinic dyes, anti-halation agents, plasticizers, and speed enhancers.

6. The process of claim 1 wherein said dye is present in the amount of from about 0.01% to about 2.0% by weight, based on the total solids content of said radiation-sensitive composition.

* * * * *